United States Patent
Wu et al.

(10) Patent No.: US 9,625,929 B2
(45) Date of Patent: Apr. 18, 2017

(54) METHOD AND DEVICE FOR OBTAINING THREE-PHASE POWER FLOW OF POWER DISTRIBUTION NETWORK WITH UNGROUNDED TRANSFORMERS

(71) Applicants: Tsinghua University, Beijing (CN); Guizhou Power Grid Information & Telecommunication Co., Ltd., Guiyang (CN)

(72) Inventors: Wenchuan Wu, Beijing (CN); Boming Zhang, Beijing (CN); Qing Zou, Guiyang (CN); Hongbin Sun, Beijing (CN); Fei Li, Guiyang (CN); Qinglai Guo, Beijing (CN); Yi Liu, Guiyang (CN); Yajing Gao, Beijing (CN); Hongjia Miao, Beijing (CN); Yuan Ji, Guiyang (CN)

(73) Assignees: Tsinghua University (CN); Guizhou Power Grid Information & Telecommunication Co., Ltd. (CN)

(*) Notice: Subject to any disclaimer, the term of this patent is extended or adjusted under 35 U.S.C. 154(b) by 396 days.

(21) Appl. No.: 14/292,022

(22) Filed: May 30, 2014

(65) Prior Publication Data
US 2015/0199301 A1    Jul. 16, 2015

(30) Foreign Application Priority Data

Jan. 10, 2014   (CN) .......................... 2014 1 0012852

(51) Int. Cl.
*G06F 7/32* (2006.01)
*G05F 1/66* (2006.01)
(Continued)

(52) U.S. Cl.
CPC ............ *G05F 1/66* (2013.01); *G01R 19/2513* (2013.01); *G01R 27/02* (2013.01); *G01R 31/027* (2013.01)

(58) Field of Classification Search
CPC ........ G05F 1/66; G01R 19/2513; G01R 27/02
(Continued)

(56) References Cited

U.S. PATENT DOCUMENTS

2004/0243377 A1* 12/2004 Roytelman ............... H02J 3/06
703/18
2012/0022713 A1* 1/2012 Deaver, Sr. ............ G05B 17/02
700/298

(Continued)

OTHER PUBLICATIONS

Nu Wenchuan et al., "Derivation of detailed transformer models and three-phase power flow for distribution system", Automation of Electric Power Systems, vol. 27, No. 4, Feb. 25, 2003, pp. 53-56 (English Abstract provided.).

*Primary Examiner* — Tan V. Mai
(74) *Attorney, Agent, or Firm* — Lerner, David, Littenberg, Krumholz & Mentlik, LLP

(57) ABSTRACT

A method for obtaining a three-phase power flow of a power distribution network and a device for obtaining a three-phase power flow of a power distribution network are provided. The method includes steps of: selecting a three-phase power transformer in the power distribution network and configuring a secondary side of the three-phase power transformer with an ungrounded neutral connection, such that the three-phase power transformer satisfies a preset voltage-current relationship; adding a constraint condition to the preset voltage-current relationship to correct a three-phase admittance matrix of the three-phase power transformer; and applying the three-phase admittance matrix to a preset algorithm to obtain a three-phase power flow of the power distribution network.

13 Claims, 1 Drawing Sheet

(51) Int. Cl.
*G01R 19/25* (2006.01)
*G01R 27/02* (2006.01)
*G01R 31/02* (2006.01)

(58) Field of Classification Search
USPC .......................................................... 708/520
See application file for complete search history.

(56) References Cited

U.S. PATENT DOCUMENTS

| | | | |
|---|---|---|---|
| 2013/0204556 A1* | 8/2013 | Sun ........................... | H02J 3/06 |
| | | | 702/60 |
| 2014/0257715 A1* | 9/2014 | Chiang ................ | G01R 21/133 |
| | | | 702/34 |

* cited by examiner

METHOD AND DEVICE FOR OBTAINING THREE-PHASE POWER FLOW OF POWER DISTRIBUTION NETWORK WITH UNGROUNDED TRANSFORMERS

CROSS-REFERENCE TO RELATED APPLICATION

This application claims priority to and benefits of Chinese Patent Application Serial No. 201410012852.2, filed with the State Intellectual Property Office of P. R. China on Jan. 10, 2014, the entire content of which is incorporated herein by reference.

FIELD

The present disclosure relates to the power system field, and more particularly to a method for obtaining a three-phase power flow of a power distribution network and a device for obtaining a three-phase power flow of a power distribution network.

BACKGROUND

A three-phase power transformer with an ungrounded neutral connection, which is commonly found in a medium voltage (MV) power distribution network, typically suffers divergence in calculating the three-phase power flow of the power distribution network.

SUMMARY

Embodiments of the present disclosure seek to solve at least one of the problems existing in the related art to at least some extent.

A first objective of the present disclosure is to provide a method for obtaining a three-phase power flow of a power distribution network, which can avoid the divergence in calculating the three-phase power flow of the power distribution network with the ungrounded neutral connection.

A second objective of the present disclosure is to provide a device for obtaining a three-phase power flow of a power distribution network.

According to a first aspect of the present disclosure, a method for obtaining a three-phase power flow of a power distribution network is provided. The method comprises the steps of: selecting a three-phase power transformer with an ungrounded neutral connection in the power distribution network; correcting a three-phase admittance matrix of the three-phase power transformer; and applying the three-phase admittance matrix to a preset algorithm to obtain the three-phase power flow of the power distribution network.

In some embodiments, the ungrounded neutral connection is at a secondary side of the three-phase power transformer, and a voltage-current relationship of the three-phase power transformer is expressed according to formula (1), $$\begin{bmatrix} I_p \\ I_s \end{bmatrix} = \begin{bmatrix} Y_{pp} & Y_{ps} \\ Y_{sp} & Y_{ss} \end{bmatrix} \begin{bmatrix} U_p \\ U_s \end{bmatrix} \quad (1)$$

where $U_p$ represents a primary voltage vector of the three-phase power transformer, $I_p$ represents a primary current vector of the three-phase power transformer, $U_s$ represents a secondary voltage vector of the three-phase power transformer, $I_s$ represents a secondary current vector of the three-phase power transformer, $$Y = \begin{bmatrix} Y_{pp} & Y_{ps} \\ Y_{sp} & Y_{ss} \end{bmatrix}$$

represents the three-phase admittance matrix of the three-phase power transformer, $Y_{pp}$ represents a self-admittance sub-matrix at the primary side, $Y_{ss}$ represents a self-admittance sub-matrix at the secondary side, $Y_{ps}$ represents a mutual admittance sub-matrix from the primary side to the secondary side, $Y_{sp}$ represents a mutual admittance sub-matrix from the secondary side to the primary side, $Y_{sp}=Y_{ps}^T$, "T" represents a transposition calculation of a matrix.

In some embodiments, correcting a three-phase admittance matrix of the three-phase power transformer comprises: adding a constraint condition to the voltage-current relationship, in which the constraint condition is expressed according to formula (2), $$U_{sa}+U_{sb}+U_{sc}=3U_0 \quad (2)$$

where $U_{sa}$, $U_{sb}$ and $U_{sc}$ represent secondary voltages on phases a, b and c respectively, $U_0$ represents a zero-sequence voltage at the secondary side; in which the voltage-current relationship with the constraint condition is expressed according to formula (3), $$\begin{bmatrix} I_p \\ I'_s \end{bmatrix} = \begin{bmatrix} Y_{pp} & Y'_{ps} \\ Y'_{sp} & Y'_{ss} \end{bmatrix} \begin{bmatrix} U_p \\ U'_s \end{bmatrix} \quad (3)$$

where $I'_s=[I_s,U_{ref}]^T$, $U_{ref}=3U_0$, $U'_s=[U_s,0]^T$, $Y'_{ps}=[Y_{ps},E_0]$, $E_0=[0,0,0]^T$, $Y'_{sp}=Y'_{ps}{}^T$;

$$Y'_{ss} = \begin{bmatrix} Y_{ss} & E_1 \\ E_1^T & 0 \end{bmatrix}$$

is reversible, $E_1=[1,1,1]^T$.

In some embodiments, the preset algorithm is a backward/forward sweep (BFS) algorithm.

In some embodiments, $I'_s$ and $U_p$ are known in the backward/forward sweep algorithm, $I_p$ and $U'_s$ are expressed according to formula (4) and formula (5) respectively, $$I_p=K'U_p+Y_{ps}Y'_{ss}{}^{-1}I'_s \quad (4)$$

$$U'_s=-Y'_{ss}{}^{-1}Y'_{sp}U_p+Y'_{ss}{}^{-1}I'_s \quad (5)$$

where $K'=Y_{pp}-Y_{ps}Y'_{ss}{}^{-1}Y'_{sp}$, $Y'_{ss}{}^{-1}$ is an inverse matrix of $Y'_{ss}$.

In some embodiments, the zero-sequence voltage is 0.

With the method for obtaining the three-phase power flow of the power distribution network according to embodiments of the present disclosure, by correcting the three-phase admittance matrix of the three-phase power transformer, the divergence in calculating the three-phase power flow of the power distribution network with the ungrounded neutral connection can be avoided, thus having practical value.

With the method for obtaining the three-phase power flow of the power distribution network according to embodiments of the present disclosure, the zero-sequence voltage is set to 0, which can reduce data storage space and computing time and save cost.

According to a second aspect of the present disclosure, a device for obtaining a three-phase power flow of a power distribution network is provided. The device comprises: a selecting module, configured for selecting a three-phase power transformer with an ungrounded neutral connection in the power distribution network; a correcting module, configured for correcting a three-phase admittance matrix of the three-phase power transformer; and an applying module, configured for applying the three-phase admittance matrix to a preset algorithm to obtain the three-phase power flow of the power distribution network.

In some embodiments, the ungrounded neutral connection is at a secondary side of the three-phase power transformer, and a voltage-current relationship of the three-phase power transformer is expressed according to formula (1), $$\begin{bmatrix} I_p \\ I_s \end{bmatrix} = \begin{bmatrix} Y_{pp} & Y_{ps} \\ Y_{sp} & Y_{ss} \end{bmatrix} \begin{bmatrix} U_p \\ U_s \end{bmatrix} \quad (1)$$

where $U_p$ represents a primary voltage vector of the three-phase power transformer, $I_p$ represents a primary current vector of the three-phase power transformer, $U_s$ represents a secondary voltage vector of the three-phase power transformer, $I_s$ represents a secondary current vector of the three-phase power transformer, $$Y = \begin{bmatrix} Y_{pp} & Y_{ps} \\ Y_{sp} & Y_{ss} \end{bmatrix}$$

represents the three-phase admittance matrix of the three-phase power transformer, $Y_{pp}$ represents a self-admittance sub-matrix at the primary side, $Y_{ss}$ represents a self-admittance sub-matrix at the secondary side, $Y_{ps}$ represents a mutual admittance sub-matrix from the primary side to the secondary side, $Y_{sp}$ represents a mutual admittance sub-matrix from the secondary side to the primary side, $Y_{sp}=Y_{ps}^T$, "T" represents a transposition calculation of a matrix.

In some embodiments, the correcting module is further configured for: adding a constraint condition to the voltage-current relationship, in which the constraint condition is expressed according to formula (2), $$U_{sa}+U_{sb}+U_{sc}=3U_0 \quad (2)$$

where $U_{sa}$, $U_{sb}$ and $U_{sc}$ represent secondary voltages on phases a, b and c respectively, $U_0$ represents a zero-sequence voltage at the secondary side; in which the voltage-current relationship with the constraint condition is expressed according to formula (3), $$\begin{bmatrix} I_p \\ I'_s \end{bmatrix} = \begin{bmatrix} Y_{pp} & Y'_{ps} \\ Y'_{sp} & Y'_{ss} \end{bmatrix} \begin{bmatrix} U_p \\ U'_s \end{bmatrix} \quad (3)$$

where $I'_s=[I_s,U_{ref}]^T$, $U_{ref}=3U_0$, $U'_s=[U_s,0]^T$, $Y'_{ps}=[Y_{ps},E_0]$, $E_0=[0,0,0]^T$, $Y'_{sp}=Y'_{ps}{}^T$;

$$Y'_{ss} = \begin{bmatrix} Y_{ss} & E_1 \\ E_1^T & 0 \end{bmatrix}$$

is reversible, $E_1=[1,1,1]^T$.

In some embodiments, the preset algorithm is the backward/forward sweep (BFS) algorithm.

In some embodiments, $I'_s$ and $U_p$ are known in the backward/forward sweep algorithm, $I_p$ and $U'_s$ are expressed according to formula (4) and formula (5) respectively, $$I_p=K'U_p+Y_{ps}Y'_{ss}{}^{-1}I'_s \quad (4)$$

$$U'_s=-Y'_{ss}{}^{-1}Y_{sp}U_p+Y'_{ss}{}^{-1}I'_s \quad (5)$$

where $K'=Y_{pp}-Y_{ps}Y'_{ss}{}^{-1}Y_{sp}$, $Y'_{ss}{}^{-1}$ is an inverse matrix of $Y'_{ss}$.

In some embodiments, the zero-sequence voltage is 0.

With the device for obtaining the three-phase power flow of the power distribution network according to embodiments of the present disclosure, by correcting the three-phase admittance matrix of the three-phase power transformer, the divergence in calculating the three-phase power flow of the power distribution network with the ungrounded neutral connection can be avoided, thus having practical value.

With the device for obtaining the three-phase power flow of the power distribution network according to embodiments of the present disclosure, the zero-sequence voltage is set to 0, which can reduce data storage space and computing time and save cost.

According to a third aspect of the present disclosure, a computer readable storage medium is provided. The computer readable storage medium comprises a computer program for executing the steps of: selecting a three-phase power transformer with an ungrounded neutral connection in the power distribution network; correcting a three-phase admittance matrix of the three-phase power transformer; and applying the three-phase admittance matrix to a preset algorithm to obtain the three-phase power flow of the power distribution network.

The above summary of the present disclosure is not intended to describe each disclosed embodiment or every implementation of the present disclosure. The Figures and the detailed descriptions which follow more particularly exemplify illustrative embodiments.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
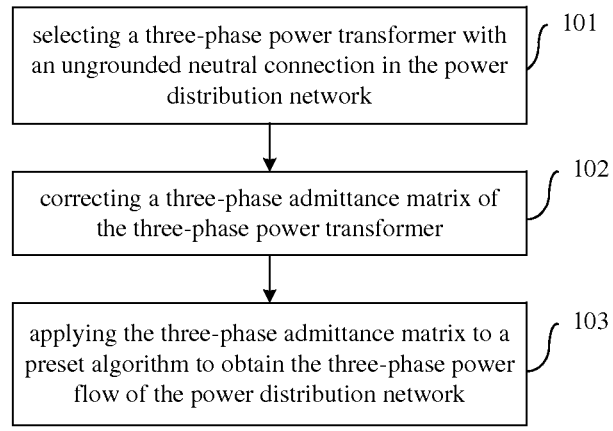
FIG. 1 is a flow chart of a method for obtaining a three-phase power flow of a power distribution network according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In addition, terms such as "first" and "second" are used herein for purposes of description and are not intended to indicate or imply relative importance or significance. Thus, the feature defined with "first" and "second" may comprise one or more this feature. In the description of the present disclosure, the term "a plurality of" means two or more than two, unless specified otherwise.

In the description of the present disclosure, it should be understood that, unless specified or limited otherwise, the terms "mounted," "connected," and "coupled" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present disclosure.

In the following, a method for obtaining a three-phase power flow of a power distribution network according to embodiments of the present disclosure will be described in detail with reference to the drawings.

FIG. 1 is a flow chart of a method for obtaining a three-phase power flow of a power distribution network according to an embodiment of the present disclosure.

As shown in FIG. 1, the method includes the following steps.

At step 101, a three-phase power transformer with an ungrounded neutral connection in the power distribution network is selected.

In some embodiments, the ungrounded neutral connection is at a secondary side of the three-phase power transformer.

Figure 2:
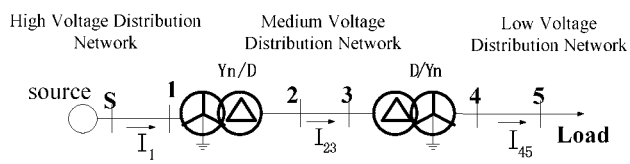
FIG. 2 is a schematic diagram of a 6-node power distribution network with three voltage levels according to an embodiment of the present disclosure.

FIG. 2 is a schematic diagram of a 6-node power distribution network with three voltage levels according to an embodiment of the present disclosure. As shown in FIG. 2, the 6-node power distribution network includes a high voltage sub power distribution network, a medium voltage sub power distribution network and a low voltage sub power distribution network. Usually, the three-phase power transformer with an ungrounded neutral connection may be found in the medium voltage sub power distribution network, and the three-phase power transformer with a grounded neutral connection may be found in the high voltage sub power distribution network and the low voltage sub power distribution network due to a security reason. For example, point 2 in FIG. 2 presents the primary side of the three-phase power transformer, and point 3 in FIG. 2 presents the secondary side of the three-phase power transformer. The three-phase power transformer typically suffers divergence in calculating the three-phase power flow of the medium voltage sub power distribution network with point 2 and point 3.

At step 102, a three-phase admittance matrix of the three-phase power transformer with the ungrounded neutral connection is corrected.

In some embodiments, a voltage-current relationship of the three-phase power transformer is expressed according to formula (1), $$\begin{bmatrix} I_p \\ I_s \end{bmatrix} = \begin{bmatrix} Y_{pp} & Y_{ps} \\ Y_{sp} & Y_{ss} \end{bmatrix} \begin{bmatrix} U_p \\ U_s \end{bmatrix} \quad (1)$$

where $U_p$ represents a primary voltage vector of the three-phase power transformer, $I_p$ represents a primary current vector of the three-phase power transformer, $U_s$ represents a secondary voltage vector of the three-phase power transformer, $I_s$ represents a secondary current vector of the three-phase power transformer, $$Y = \begin{bmatrix} Y_{pp} & Y_{ps} \\ Y_{sp} & Y_{ss} \end{bmatrix}$$

represents the three-phase admittance matrix of the three-phase power transformer, $Y_{pp}$ represents a self-admittance sub-matrix at the primary side, $Y_{ss}$ represents a self-admittance sub-matrix at the secondary side, $Y_{ps}$ represents a mutual admittance sub-matrix from the primary side to the secondary side, $Y_{sp}$ represents a mutual admittance sub-matrix from the secondary side to the primary side, $Y_{sp}=Y_{ps}^T$, "T" represents a transposition calculation of a matrix.

The three-phase power transformer typically suffers divergence in calculating the three-phase power flow due to the singularity of the three-phase admittance matrix and its sub-matrixes (for example, the self-admittance sub-matrix at the secondary side). Therefore, it is necessary to correct the three-phase admittance matrix of the three-phase power transformer.

In some embodiments, step 102 includes: a constraint condition is added to the voltage-current relationship, in which the constraint condition is expressed according to formula (2), $$U_{sa}+U_{sb}+U_{sc}=3U_0 \quad (2)$$

where $U_{sa}$, $U_{sb}$ and $U_{sc}$ represent secondary voltages on phases a, b and c respectively, $U_0$ represents a zero-sequence voltage at the secondary side, in which the voltage-current relationship with the constraint condition is expressed according to formula (3), $$\begin{bmatrix} I_p \\ I'_s \end{bmatrix} = \begin{bmatrix} Y_{pp} & Y'_{ps} \\ Y'_{sp} & Y'_{ss} \end{bmatrix} \begin{bmatrix} U_p \\ U'_s \end{bmatrix} \quad (3)$$

where $I'_s=[I_s,U_{ref}]^T$, $U_{ref}=3U_0$, $U'_s=[U_s,0]^T$, $Y'_{ps}=[Y_{ps},E_0]$, $E_0=[0,0,0]^T$, $Y'_{sp}=Y'_{ps}{}^T$;

$$Y'_{ss} = \begin{bmatrix} Y_{ss} & E_1 \\ E_1^T & 0 \end{bmatrix}$$

is reversible, $E_1=[1,1,1]^T$.

In some embodiments, the zero-sequence voltage is 0. There is no zero-sequence route between the medium voltage power distribution network and other power distribution networks, so the zero-sequence voltage does not affect loads of other power distribution networks and the low voltage power distribution networks, also does not affect the iterative number in calculating the three-phase power flow. Therefore, the zero-sequence voltage is set to 0, which can reduce data storage space and computing time and save cost.

At step 103, the three-phase admittance matrix is applied to a preset algorithm to obtain the three-phase power flow of the power distribution network.

In some embodiments, the preset algorithm is the backward/forward sweep (BFS) algorithm which is one of the main methods for calculating the three-phase power flow. As shown in FIG. 2, the backward sweep means calculating the currents from "source" to "load", and the forward sweep means calculating the voltages from "load" to "source".

In some embodiments, $I'_s$ and $U_p$ are known in the backward/forward sweep algorithm, $I_p$ and $U'_s$ are expressed according to formula (4) and formula (5) respectively, $$I_p = K'U_p + Y_{ps}Y'^{-1}_{ss}I'_s \qquad (4)$$

$$U'_s = -Y'^{-1}_{ss}Y'_{sp}U_p + Y'^{-1}_{ss}I'_s \qquad (5)$$

where $K' = Y_{pp} - Y_{ps}Y'^{-1}_{ss}Y'_{sp}$, $Y'^{-1}_{ss}$ is an inverse matrix of $Y'_{ss}$.

With the method for obtaining the three-phase power flow of the power distribution network according to embodiments of the present disclosure, by correcting the three-phase admittance matrix of the three-phase power transformer, the divergence in calculating the three-phase power flow of the power distribution network with the ungrounded neutral connection can be avoided, thus having practical value.

With the method for obtaining the three-phase power flow of the power distribution network according to embodiments of the present disclosure, the zero-sequence voltage is set to 0, which can reduce data storage space and computing time and save cost.

In the following, a device for obtaining a three-phase power flow of a power distribution network according to embodiments of the present disclosure will be described in detail with reference to the drawings.

Figure 3:
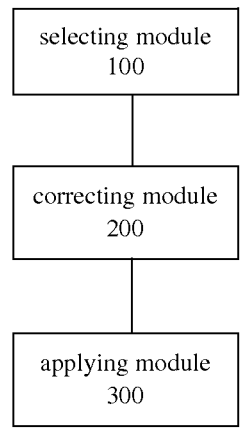
FIG. 3 is a block diagram of a device for obtaining a three-phase power flow of a power distribution network according to an embodiment of the present disclosure.

FIG. 3 is a block diagram of a device for obtaining a three-phase power flow of a power distribution network according to an embodiment of the present disclosure.

As shown in FIG. 3, the device comprises a selecting module 100, a correcting module 200 and an applying module 300.

Specifically, the selecting module 100 is configured for selecting a three-phase power transformer with an ungrounded neutral connection in the power distribution network.

In some embodiments, the ungrounded neutral connection is at a secondary side of the three-phase power transformer.

FIG. 2 is a schematic diagram of a 6-node power distribution network with three voltage levels according to an embodiment of the present disclosure. As shown in FIG. 2, the 6-node power distribution network includes a high voltage sub power distribution network, a medium voltage sub power distribution network and a low voltage sub power distribution network. Usually, the three-phase power transformer with an ungrounded neutral connection may be found in the medium voltage sub power distribution network, and the three-phase power transformer with a grounded neutral connection may be found in the high voltage sub power distribution network and the low voltage sub power distribution network due to a security reason. For example, point 2 in FIG. 2 presents the primary side of the three-phase power transformer, and point 3 in FIG. 2 presents the secondary side of the three-phase power transformer. The three-phase power transformer typically suffers divergence in calculating the three-phase power flow of the medium voltage sub power distribution network with point 2 and point 3.

The correcting module 200 is configured for correcting a three-phase admittance matrix of the three-phase power transformer.

In some embodiments, a voltage-current relationship of the three-phase power transformer is expressed according to formula (1), $$\begin{bmatrix} I_p \\ I_s \end{bmatrix} = \begin{bmatrix} Y_{pp} & Y_{ps} \\ Y_{sp} & Y_{ss} \end{bmatrix} \begin{bmatrix} U_p \\ U_s \end{bmatrix} \qquad (1)$$

where $U_p$ represents a primary voltage vector of the three-phase power transformer, $I_p$ represents a primary current vector of the three-phase power transformer, $U_s$ represents a secondary voltage vector of the three-phase power transformer, $I_s$ represents a secondary current vector of the three-phase power transformer, $$Y = \begin{bmatrix} Y_{pp} & Y_{ps} \\ Y_{sp} & Y_{ss} \end{bmatrix}$$

represents the three-phase admittance matrix of the three-phase power transformer, $Y_{pp}$ represents a self-admittance sub-matrix at the primary side, $Y_{ss}$ represents a self-admittance sub-matrix at the secondary side, $Y_{ps}$ represents a mutual admittance sub-matrix from the primary side to the secondary side, $Y_{sp}$ represents a mutual admittance sub-matrix from the secondary side to the primary side, $Y_{sp} = Y_{ps}^T$, "T" represents a transposition calculation of a matrix.

The three-phase power transformer typically suffers divergence in calculating the three-phase power flow due to the singularity of the three-phase admittance matrix and its sub-matrixes (for example, the self-admittance sub-matrix at the secondary side). Therefore, it is necessary to correct the three-phase admittance matrix of the three-phase power transformer.

In some embodiments, the correcting module 200 is configured for adding a constraint condition to the voltage-current relationship, in which the constraint condition is expressed according to formula (2), $$U_{sa} + U_{sb} + U_{sc} = 3U_0 \qquad (2)$$

where $U_{sa}$, $U_{sb}$ and $U_{sc}$ represent secondary voltages on phases a, b and c respectively, $U_0$ represents a zero-sequence voltage at the secondary side, in which the voltage-current relationship with the constraint condition is expressed according to formula (3), $$\begin{bmatrix} I_p \\ I'_s \end{bmatrix} = \begin{bmatrix} Y_{pp} & Y'_{ps} \\ Y'_{sp} & Y'_{ss} \end{bmatrix} \begin{bmatrix} U_p \\ U'_s \end{bmatrix} \qquad (3)$$

where $I'_s = [I_s, U_{ref}]^T$, $U_{ref} = 3U_0$, $U'_s = [U_s, 0]^T$, $Y'_{ps} = [Y_{ps}, E_0]$, $E_0 = [0,0,0]^T$, $Y'_{sp} = Y'^T_{ps}$;

$$Y'_{ss} = \begin{bmatrix} Y_{ss} & E_1 \\ E_1^T & 0 \end{bmatrix}$$

is reversible, $E_1 = [1,1,1]^T$.

In some embodiments, the zero-sequence voltage is 0. There is no zero-sequence route between the medium voltage power distribution network and other power distribution networks, so the zero-sequence voltage does not affect loads of other power distribution networks and the low voltage power distribution networks, also does not affect an iterative number in calculating the three-phase power flow. Therefore, the zero-sequence voltage is set to 0, which can reduce data storage space and computing time and save cost.

The applying module 300 is configured for applying the three-phase admittance matrix to a preset algorithm to obtain the three-phase power flow of the power distribution network.

In some embodiments, the preset algorithm is the backward/forward sweep (BFS) algorithm which is one of the main methods for calculating the three-phase power flow. As shown in FIG. 2, the backward sweep means calculating the currents from "source" to "load", and the forward sweep means calculating the voltages from "load" to "source".

In some embodiments, $I'_s$ and $U_p$ are known in the backward/forward sweep algorithm, $I_p$ and $U'_s$ are expressed according to formula (4) and formula (5) respectively, $$I_p = K'U_p + Y_{ps}Y'^{-1}_{ss}I'_s \qquad (4)$$

$$U'_s = -Y'^{-1}_{ss}Y_{sp}U_p + Y'^{-1}_{ss}I'_s \qquad (5)$$

where $K' = Y_{pp} - Y_{ps}Y'^{-1}_{ss}Y_{sp}$, $Y'^{-1}_{ss}$ is an inverse matrix of $Y'_{ss}$.

With the device for obtaining the three-phase power flow of the power distribution network according to embodiments of the present disclosure, by correcting the three-phase admittance matrix of the three-phase power transformer, the divergence in calculating the three-phase power flow of the power distribution network with the ungrounded neutral connection can be avoided, thus having practical value.

With the device for obtaining the three-phase power flow of the power distribution network according to embodiments of the present disclosure, the zero-sequence voltage is set to 0, which can reduce data storage space and computing time and save cost.

In the following, a computer readable storage medium according to embodiments of the present disclosure will be described in detail.

In some embodiments, the computer readable storage medium comprises a computer program for executing steps of: selecting a three-phase power transformer with an ungrounded neutral connection in a power distribution network; correcting a three-phase admittance matrix of the three-phase power transformer; and applying the three-phase admittance matrix to a preset algorithm to obtain a three-phase power flow of the power distribution network.

Any process or method described in the flowing diagram or other means may be understood as a module, segment or portion including one or more executable instruction codes of the procedures configured to achieve a certain logic function or process, and the preferred embodiments of the present disclosure include other performances, in which the performance may be achieved in other orders instead of the order shown or discussed, such as in a almost simultaneous way or in an opposite order, which should be appreciated by those having ordinary skills in the art to which embodiments of the present disclosure belong.

The logic and/or procedures indicated in the flowing diagram or described in other means herein, such as a constant sequence table of the executable code for perfouning a logical function, may be implemented in any computer readable storage medium so as to be adopted by the code execution system, the device or the equipment (such a system based on the computer, a system including a processor or other systems fetching codes from the code execution system, the device and the equipment, and executing the codes) or to be combined with the code execution system, the device or the equipment to be used. With respect to the description of the present invention, "the computer readable storage medium" may include any device including, storing, communicating, propagating or transmitting program so as to be used by the code execution system, the device and the equipment or to be combined with the code execution system, the device or the equipment to be used. The computer readable medium includes specific examples (a non-exhaustive list): the connecting portion (electronic device) having one or more arrangements of wire, the portable computer disc cartridge (a magnetic device), the random access memory (RAM), the read only memory (ROM), the electrically programmable read only memory (EPROMM or the flash memory), the optical fiber device and the compact disk read only memory (CDROM). In addition, the computer readable storage medium even may be papers or other proper medium printed with program, as the papers or the proper medium may be optically scanned, then edited, interpreted or treated in other ways if necessary to obtain the program electronically which may be stored in the computer memory.

It should be understood that, each part of the present invention may be implemented by the hardware, software, firmware or the combination thereof. In the above embodiments of the present invention, the plurality of procedures or methods may be implemented by the software or hardware stored in the computer memory and executed by the proper code execution system. For example, if the plurality of procedures or methods is to be implemented by the hardware, like in another embodiment of the present invention, any one of the following known technologies or the combination thereof may be used, such as discrete logic circuits having logic gates for implementing various logic functions upon an application of one or more data signals, application specific integrated circuits having appropriate logic gates, programmable gate arrays (PGA), field programmable gate arrays (FPGA).

It can be understood by those having the ordinary skills in the related art that all or part of the steps in the method of the above embodiments can be implemented by instructing related hardware via programs, the program may be stored in a computer readable storage medium, and the program includes one step or combinations of the steps of the method when the program is executed.

In addition, each functional unit in the present disclosure may be integrated in one progressing module, or each functional unit exists as an independent unit, or two or more functional units may be integrated in one module. The integrated module can be embodied in hardware, or software. If the integrated module is embodied in software and sold or used as an independent product, it can be stored in the computer readable storage medium.

The computer readable storage medium may be, but is not limited to, read-only memories, magnetic disks, or optical disks.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for obtaining a three-phase power flow of a power distribution network, comprising steps of:

selecting a three-phase power transformer in the power distribution network, and configuring a secondary side of the three-phase power transformer with an ungrounded neutral connection, such that the three-phase power transformer satisfies a preset voltage-current relationship;

adding a constraint condition to the preset voltage-current relationship to correct a three-phase admittance matrix of the three-phase power transformer; and applying the three-phase admittance matrix to a preset algorithm to obtain the three-phase power flow of the power distribution network.

2. The method according to claim 1, wherein the preset voltage-current relationship of the three-phase power transformer is expressed according to formula (1), $$\begin{bmatrix} I_p \\ I_s \end{bmatrix} = \begin{bmatrix} Y_{pp} & Y_{ps} \\ Y_{sp} & Y_{ss} \end{bmatrix} \begin{bmatrix} U_p \\ U_s \end{bmatrix} \quad (1)$$

where $U_p$ represents a primary voltage vector of the three-phase power transformer, $I_p$ represents a primary current vector of the three-phase power transformer, $U_s$ represents a secondary voltage vector of the three-phase power transformer, $I_s$ represents a secondary current vector of the three-phase power transformer, $$Y = \begin{bmatrix} Y_{pp} & Y_{ps} \\ Y_{sp} & Y_{ss} \end{bmatrix}$$

represents the three-phase admittance matrix of the three-phase Y phase power transformer, $Y_{pp}$ represents a self-admittance sub-matrix at the primary side, $Y_{ss}$ represents a self-admittance sub-matrix at the secondary side, $Y_{ps}$ represents a mutual admittance sub-matrix from the primary side to the secondary side, $Y_{sp}$ represents a mutual admittance sub-matrix from the secondary side to the primary side, $Y_{sp}=Y_{ps}^T$, "T" represents a transposition calculation of a matrix.

3. The method according to claim 2, wherein the constraint condition is expressed according to formula (2), $$U_{sa}+U_{sb}+U_{sc}=3U_0 \quad (2)$$

where $U_{sa}$, $U_{sb}$ and $U_{sc}$ represent secondary voltages on phases a, b and c respectively, $U_0$ represents a zero-sequence voltage at the secondary side;

wherein the voltage-current relationship with the constraint condition is expressed according to formula (3), $$\begin{bmatrix} I_p \\ I'_s \end{bmatrix} = \begin{bmatrix} Y_{pp} & Y'_{ps} \\ Y'_{sp} & Y'_{ss} \end{bmatrix} \begin{bmatrix} U_p \\ U'_s \end{bmatrix} \quad (3)$$

where $I'_s=[I_s,U_{ref}]^T$, $U_{ref}=3U_0$, $U'_s=[U'_s,0]^T$, $Y'_{ps}=[Y_{ps},E_0]$, $E_0=[0,0,0]^T$, $Y'_{sp}=Y'_{ps}{}^T$, $$Y'_{ss} = \begin{bmatrix} Y_{ss} & E_1 \\ E_1^T & 0 \end{bmatrix}$$

is reversible, $E_1=[1,1,1]^T$.

4. The method according to claim 3, wherein the preset algorithm is a backward/forward sweep algorithm.

5. The method according to claim 4, wherein $I'_s$ and $U_p$ are known in the backward/forward sweep algorithm, $I_p$ and $U'_s$ are expressed according to formula (4) and formula (5) respectively, $$I_p=K'U_p+Y'_{ps}Y'_{ss}{}^{-1}I'_s \quad (4)$$

$$U'_s=-Y'_{ss}{}^{-1}Y'_{sp}U_p+Y'_{ss}{}^{-1}I'_s \quad (5)$$

where $K'=Y_{pp}-Y'_{ps}Y'_{ss}{}^{-1}Y'_{ps}$, $Y'_{ss}{}^{-1}$ is an inverse matrix of $Y'_{ss}$.

6. The method according to claim 3, wherein the zero-sequence voltage is 0.

7. A device for obtaining a three-phase power flow of a power distribution network, comprising:

a selecting module, configured for selecting a three-phase power transformer in the power distribution network and configuring a secondary side of the three-phase power transformer with an ungrounded neutral connection, such that the three-phase power transformer satisfies a preset voltage-current relationship;

a correcting module, configured for adding a constraint condition to the preset voltage-current relationship to correct a three-phase admittance matrix of the three-phase power transformer;

an applying module, configured for applying the three-phase admittance matrix to a preset algorithm to obtain the three-phase power flow of the power distribution network; and a non-transitory computer-readable medium comprising computer-executable instructions stored thereon; and an instruction execution system, which is configured by the instructions to implement at least one of above modules.

8. The device according to claim 7, wherein the preset voltage-current relationship of the three-phase power transformer is expressed according to formula (1), $$\begin{bmatrix} I_p \\ I_s \end{bmatrix} = \begin{bmatrix} Y_{pp} & Y_{ps} \\ Y_{sp} & Y_{ss} \end{bmatrix} \begin{bmatrix} U_p \\ U_s \end{bmatrix} \quad (1)$$

where $U_p$ represents a primary voltage vector of the three-phase power transformer, $I_p$ represents a primary current vector of the three-phase power transformer, $U_s$ represents a secondary voltage vector of the three-phase power transformer, $I_s$ represents a secondary current vector of the three-phase power transformer, $$Y = \begin{bmatrix} Y_{pp} & Y_{ps} \\ Y_{sp} & Y_{ss} \end{bmatrix}$$

represents the three-phase admittance matrix of the three-phase power transformer, $Y_{pp}$ represents a self-admittance sub-matrix at the primary side, $Y_{ss}$ represents a self-admittance sub-matrix at the secondary side, $Y_{ps}$ represents a mutual admittance sub-matrix from the primary side to the secondary side, $Y_{sp}$ represents a mutual admittance sub-matrix from the secondary side to the primary side, $Y_{sp}=Y_{ps}{}^T$, "T" represents a transposition calculation of a matrix.

9. The device according to claim 8, wherein
the constraint condition is expressed according to formula (2), $$U_{sa}+U_{sb}+U_{sc}=3U_0 \qquad (2)$$

where $U_{sa}$, $U_{sb}$ and $U_{sc}$ represent secondary voltages on phases a, b and c respectively, $U_0$ represents a zero-sequence voltage at the secondary side;

wherein the voltage-current relationship with the constraint condition is expressed according to formula (3), $$\begin{bmatrix} I_p \\ I'_s \end{bmatrix} = \begin{bmatrix} Y_{pp} & Y'_{ps} \\ Y'_{sp} & Y'_{ss} \end{bmatrix} \begin{bmatrix} U_p \\ U'_s \end{bmatrix} \qquad (3)$$

where $I'_s=[I_s,U_{ref}]^T$, $U_{ref}=3U_0$, $U'_s=[U_s,0]^T$, $Y'_{ps}=[Y_{ps},E_0]$, $E_0=[0,0,0]^T$, $Y'_{sp}=Y'_{ps}{}^T$, $$Y'_{ss} = \begin{bmatrix} Y_{ss} & E_1 \\ E_1^T & 0 \end{bmatrix}$$

is reversible, $E_1=[1,1,1]^T$.

10. The device according to claim 9, wherein the preset algorithm is a backward/forward sweep algorithm.

11. The device according to claim 10, wherein $I'_s$ and $U_p$ are known in the backward/forward sweep algorithm, $I_p$ and $U'_s$ are expressed according to formula (4) and formula (5) respectively, $$I_p=K'U_p+Y_{ps}Y'_{ss}{}^{-1}I'_s \qquad (4)$$

$$U'_s=-Y'_{ss}{}^{-1}Y_{sp}U_p+Y'_{ss}{}^{-1}I'_s \qquad (5)$$

where $K'=Y_{pp}-Y_{ps}Y'_{ss}{}^{-1}Y_{sp}$, $Y'_{ss}{}^{-1}$ is an inverse matrix of $Y'_{ss}$.

12. The device according to claim 9, wherein the zero-sequence voltage is 0.

13. A computer readable storage medium, comprising a computer program for executing steps of:
selecting a three-phase power transformer with an ungrounded neutral connection in a power distribution network, and configuring a secondary side of the three-phase power transformer with an ungrounded neutral connection, such that the three-phase power transformer satisfies a preset voltage-current relationship;
adding a constraint condition to the preset voltage-current relationship to correcting a three-phase admittance matrix of the three-phase power transformer; and
applying the three-phase admittance matrix to a preset algorithm to obtain a three-phase power flow of the power distribution network.

* * * * *